United States Patent
Nag et al.

(10) Patent No.: US 10,693,420 B2
(45) Date of Patent: *Jun. 23, 2020

(54) LOW DISTORTION MULTIPLE POWER AMPLIFIER POWER SUPPLY

(71) Applicant: Qorvo US, Inc., Greensboro, NC (US)

(72) Inventors: Manbir Singh Nag, Oak Ridge, NC (US); Michael R. Kay, Summerfield, NC (US); Philippe Gorisse, Brax (FR); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/119,402

(22) Filed: Aug. 31, 2018

(65) Prior Publication Data
US 2018/0375475 A1 Dec. 27, 2018

Related U.S. Application Data

(63) Continuation of application No. 15/382,773, filed on Dec. 19, 2016, now Pat. No. 10,079,575.

(Continued)

(51) Int. Cl.
*H03F 1/02* (2006.01)
*H04W 52/52* (2009.01)
(Continued)

(52) U.S. Cl.
CPC .......... *H03F 1/0222* (2013.01); *H03F 3/193* (2013.01); *H03F 3/245* (2013.01); *H04W 52/52* (2013.01);
(Continued)

(58) Field of Classification Search
USPC ................. 330/136, 297, 279, 127
See application file for complete search history.

(56) References Cited

U.S. PATENT DOCUMENTS 8,981,839 B2   3/2015   Kay et al.
9,380,537 B2   6/2016   Bar-David
(Continued)

OTHER PUBLICATIONS

Fayomi, Christian Jésus B. et al., "Design and Characterization of Low-Voltage Analog Switch Without the Need for Clock Boosting," The 47th IEEE International Midwest Symposium on Circuits and Systems, MWSCAS'04, vol. 3, Aug. 2004, IEEE, pp. 315-318.

(Continued)

*Primary Examiner* — Hieu P Nguyen
(74) *Attorney, Agent, or Firm* — Withrow & Terranova, P.L.L.C.

(57) ABSTRACT

A PA power supply, which includes a first ET power supply, power supply control circuitry, a first PMOS switching element, and a second PMOS switching element, is disclosed. During a first operating mode, the power supply control circuitry selects an OFF state of the first PMOS switching element, selects an ON state of the second PMOS switching element, and adjusts a voltage of a first switch control signal to maintain the OFF state of the first PMOS switching element using a voltage at a source of the first PMOS switching element and a voltage at a drain of the first PMOS switching element; the PA power supply provides a first PA power supply signal; and the first ET power supply provides a first ET power supply signal, such that the first PA power supply signal is based on the first ET power supply signal.

20 Claims, 14 Drawing Sheets

Related U.S. Application Data

(60) Provisional application No. 62/268,531, filed on Dec. 17, 2015.

(51) Int. Cl.
 *H03F 3/193* (2006.01)
 *H03F 3/24* (2006.01)

(52) U.S. Cl.
 CPC .. *H03F 2200/102* (2013.01); *H03F 2200/105* (2013.01); *H03F 2200/451* (2013.01); *H03F 2200/507* (2013.01)

(56) References Cited

U.S. PATENT DOCUMENTS 9,438,172 B2 * 9/2016 Cohen .................. H03F 1/0233
10,079,575 B2 9/2018 Nag et al.

OTHER PUBLICATIONS

Notice of Allowance for U.S. Appl. No. 15/382,773, dated May 22, 2018, 8 pages.
Non-Final Office Action for U.S. Appl. No. 15/382,773, dated Sep. 6, 2017, 7 pages.

* cited by examiner

U.S. 10,693,420 B2

LOW DISTORTION MULTIPLE POWER AMPLIFIER POWER SUPPLY

RELATED APPLICATIONS

This application is a continuation of U.S. patent application Ser. No. 15/382,773, filed Dec. 19, 2016, now issued as U.S. Pat. No. 10,079,575, which claims the benefit of U.S. Provisional Patent Application No. 62/268,531, filed Dec. 17, 2015, the disclosures of which are hereby incorporated herein by reference in their entireties.

FIELD OF THE DISCLOSURE

Embodiments of the present disclosure relate to switching power supplies, analog power supplies, and radio frequency (RF) power amplifiers, any or all of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

A power amplifier (PA) power supply, which includes a first envelope tracking (ET) power supply, power supply control circuitry, a first P-type metal oxide semiconductor (PMOS) switching element, and a second PMOS switching element, is disclosed according to one embodiment of the present disclosure. The PA power supply has a first PA connection node and operates in one of a group of operating modes. During a first operating mode of the group of operating modes, the power supply control circuitry selects an OFF state of the first PMOS switching element, selects an ON state of the second PMOS switching element, and adjusts a voltage of the first switch control signal to maintain the OFF state of the first PMOS switching element using a voltage at a source of the first PMOS switching element and a voltage at a drain of the first PMOS switching element. Additionally, during the first operating mode, the PA power supply provides a first PA power supply signal and the first ET power supply provides a first ET power supply signal, such that the first PA power supply signal is based on the first ET power supply signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

A PA power supply, which includes a first ET power supply, power supply control circuitry, a first PMOS switching element, and a second PMOS switching element, is disclosed according to one embodiment of the present disclosure. The PA power supply has a first PA connection node and operates in one of a group of operating modes. During a first operating mode of the group of operating modes, the power supply control circuitry selects an OFF state of the first PMOS switching element, selects an ON state of the second PMOS switching element, and adjusts a voltage of a first switch control signal to maintain the OFF state of the first PMOS switching element using a voltage at a source of the first PMOS switching element and a voltage at a drain of the first PMOS switching element. Additionally, during the first operating mode, the PA power supply provides a first PA power supply signal and the first ET power supply provides a first ET power supply signal, such that the first PA power supply signal is based on the first ET power supply signal.

Figure 1:
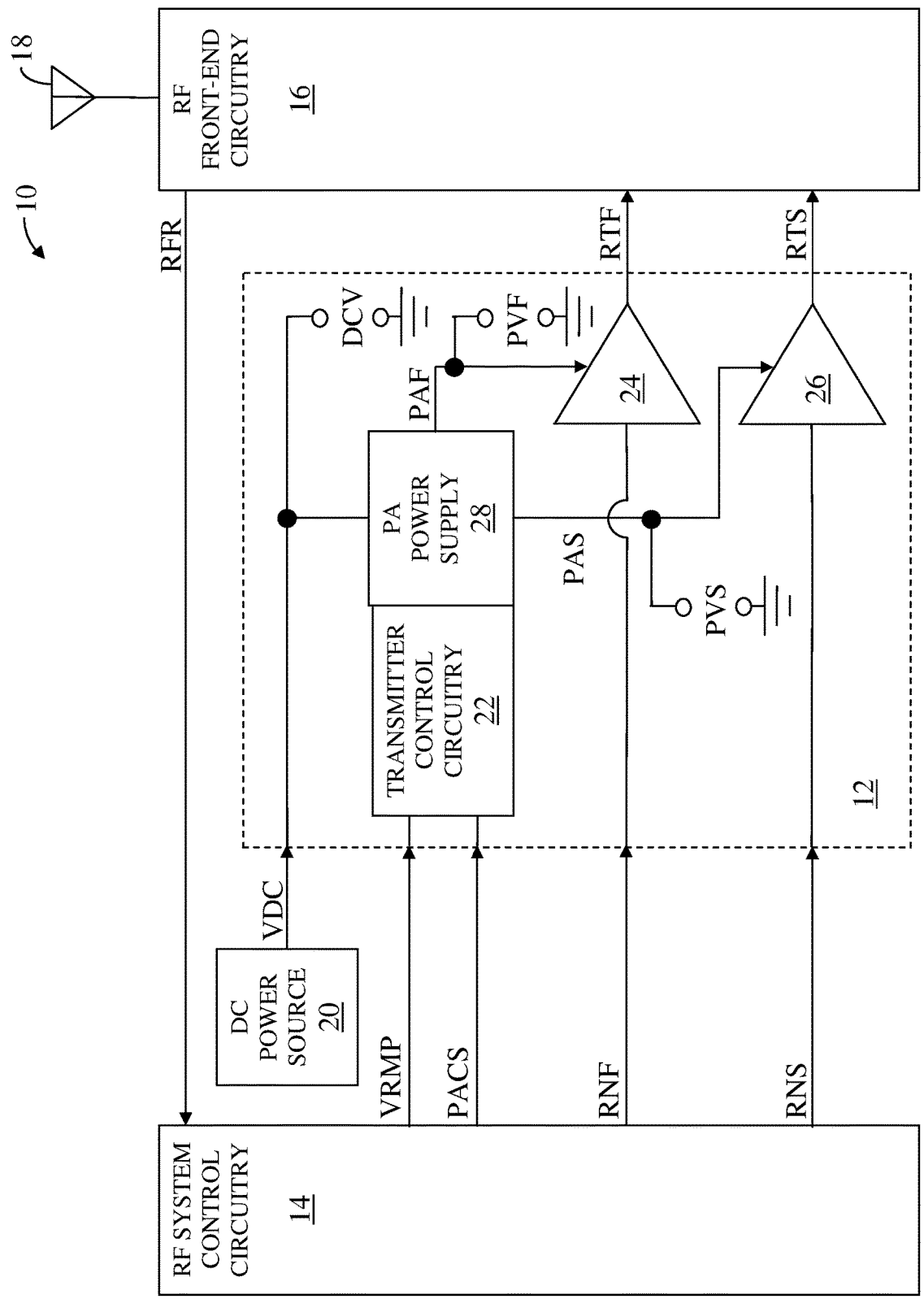
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, a first RF PA 24, a second RF PA 26, and a PA power supply 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides a first RF input signal RNF to the first RF PA 24 and a second RF input signal RNS to the second RF PA 26. The DC power source 20 provides a DC source signal VDC to the PA power supply 28. The DC source signal VDC has a DC source voltage DCV. In one embodiment of the DC power source 20, the DC power source 20 is a battery.

The transmitter control circuitry 22 is coupled to the PA power supply 28. The PA power supply 28 provides a first PA power supply signal PAF to the first RF PA 24 based on the envelope power supply control signal VRMP. The PA power supply 28 further provides a second PA power supply signal PAS to the second RF PA 26 based on the envelope power supply control signal VRMP. The first PA power supply signal PAF has a first PA power supply voltage PVF and the second PA power supply signal PAS has a second PA power supply voltage PVS. The DC source signal VDC provides power to the PA power supply 28. As such, the first PA power supply signal PAF is based on the DC source signal VDC and the second PA power supply signal PAS is based on the DC source signal VDC. The envelope power supply control signal VRMP is representative of a setpoint of the first PA power supply signal PAF. The envelope power supply control signal VRMP is also representative of a setpoint of the second PA power supply signal PAS.

The first RF PA 24 receives and amplifies the first RF input signal RNF to provide a first RF transmit signal RTF using the first PA power supply signal PAF. The first PA power supply signal PAF provides power for amplification. The second RF PA 26 receives and amplifies the second RF input signal RNS to provide a second RF transmit signal RTS using the second PA power supply signal PAS. The second PA power supply signal PAS provides power for amplification.

In one embodiment of the RF communications system 10, the RF front-end circuitry 16 receives, processes, and transmits the first RF transmit signal RTF via the RF antenna 18. In one embodiment of the RF communications system 10, the RF front-end circuitry 16 receives, processes, and transmits the second RF transmit signal RTS via the RF antenna 18. In one embodiment of the RF transmitter circuitry 12, the transmitter control circuitry 22 configures the RF transmitter circuitry 12 based on the transmitter configuration signal PACS.

In this regard, in one embodiment of the RF communications system 10, the RF communications system 10 communicates with other RF communications systems (not shown). Such communications may utilize the first RF transmit signal RTF, the second RF transmit signal RTS, the RF receive signal RFR, other RF signals (not shown), or any combination thereof.

In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
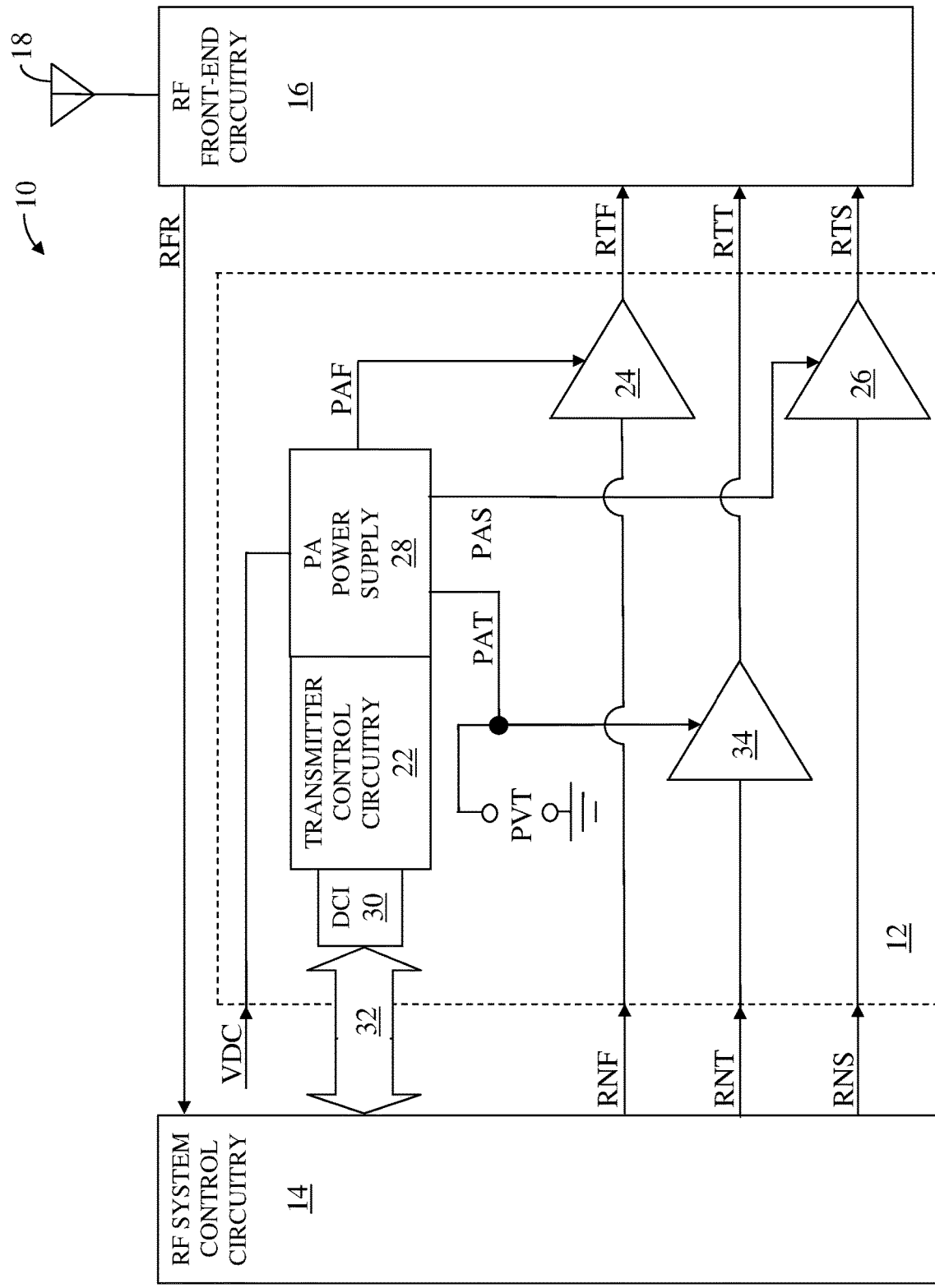
FIG. 2 shows the RF communications system according to an alternate embodiment of the RF communications system.

FIG. 2 shows the RF communications system 10 according to an alternate embodiment of the RF communications system 10. In one embodiment of the RF communications system 10, the RF communications system 10 and the PA power supply 28 operate in one of a group of operating modes. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

In one embodiment of the RF transmitter circuitry 12, the RF transmitter circuitry 12 further includes a third RF PA 34. The RF system control circuitry 14 provides a third RF input signal RNT to the third RF PA 34. The PA power supply 28 provides a third PA power supply signal PAT to the third RF PA 34 based on the envelope power supply control signal VRMP (FIG. 1). The third PA power supply signal PAT has a third PA power supply voltage PVT. The third PA power supply signal PAT is based on the DC source signal VDC. The envelope power supply control signal VRMP (FIG. 1) is representative of a setpoint of the third PA power supply signal PAT. The third RF PA 34 receives and amplifies the third RF input signal RNT to provide a third RF transmit signal RTT using the third PA power supply signal PAT. The third PA power supply signal PAT provides power for amplification.

In one embodiment of the RF communications system 10, the RF front-end circuitry 16 receives, processes, and transmits the third RF transmit signal RTT via the RF antenna 18. In this regard, in one embodiment of the RF communications system 10, the RF communications system 10 communicates with other RF communications systems (not shown). Such communications may utilize the third RF transmit signal RTT.

In one embodiment of the RF communications system 10, any or all of the first RF transmit signal RTF, the second RF transmit signal RTS, and the third RF transmit signal RTT may be used for cellular communications. Any or all of the first RF transmit signal RTF, the second RF transmit signal RTS, and the third RF transmit signal RTT may be provided simultaneously, such that the RF communications system 10 provides transmit uplink carrier aggregation (TXULCA), such that any or all of the first RF transmit signal RTF, the second RF transmit signal RTS, and the third RF transmit signal RTT are TXULCA signals. In one embodiment of the RF communications system 10, any or all of the first RF transmit signal RTF, the second RF transmit signal RTS, and the third RF transmit signal RTT may be used to provide Wi-Fi transmissions.

In one embodiment of the RF communications system 10, any or all of the first RF transmit signal RTF, the second RF transmit signal RTS, and the third RF transmit signal RTT may be used to provide a low-band transmit signal, a mid-band transmit signal, a high-band transmit signal, or any combination thereof.

Figure 5:
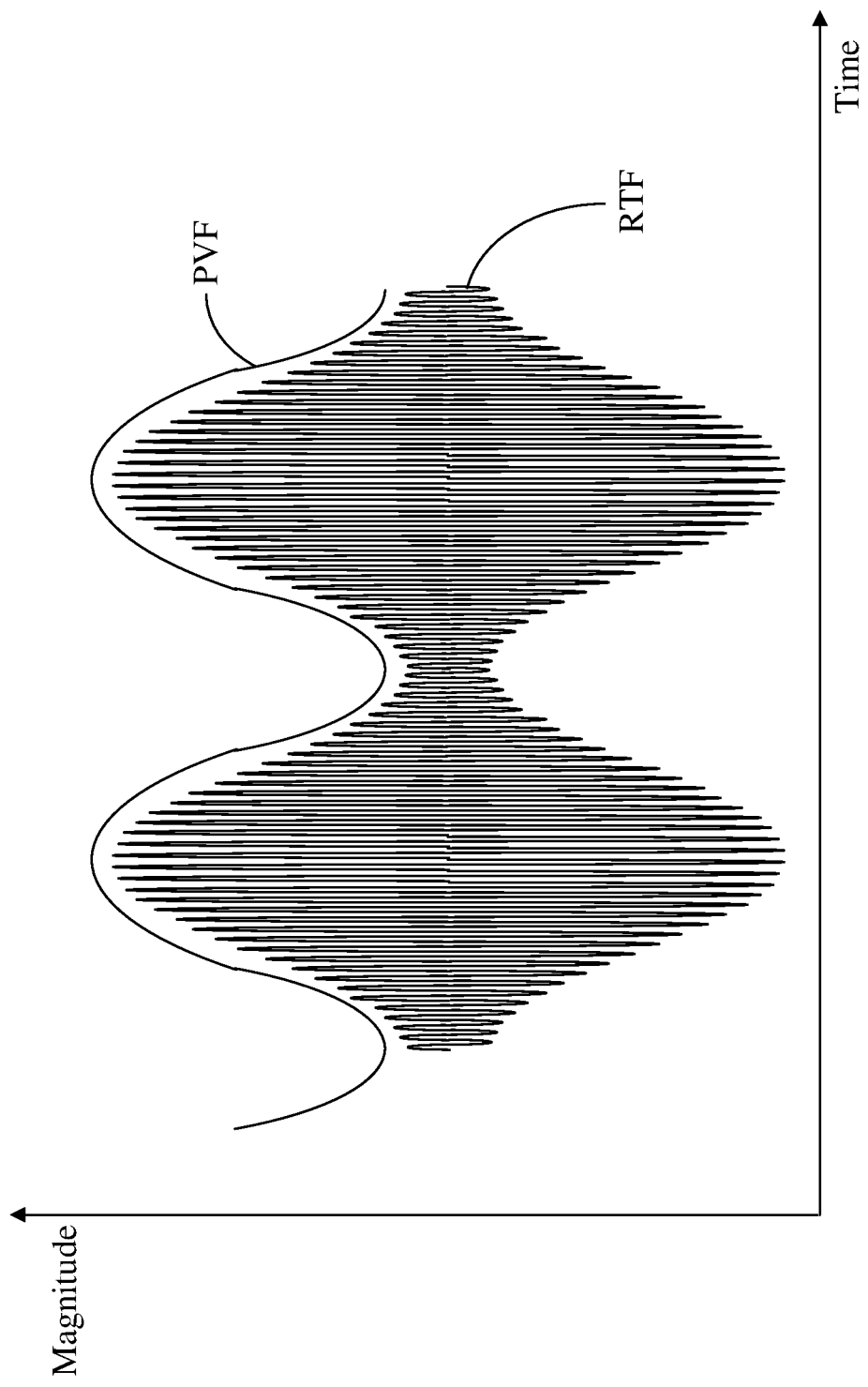
FIG. 5 is a graph illustrating a first RF transmit signal and a first PA power supply voltage of the RF communications system shown in FIG. 1 during envelope tracking, according to one embodiment of the RF communications system.
Figure 6:
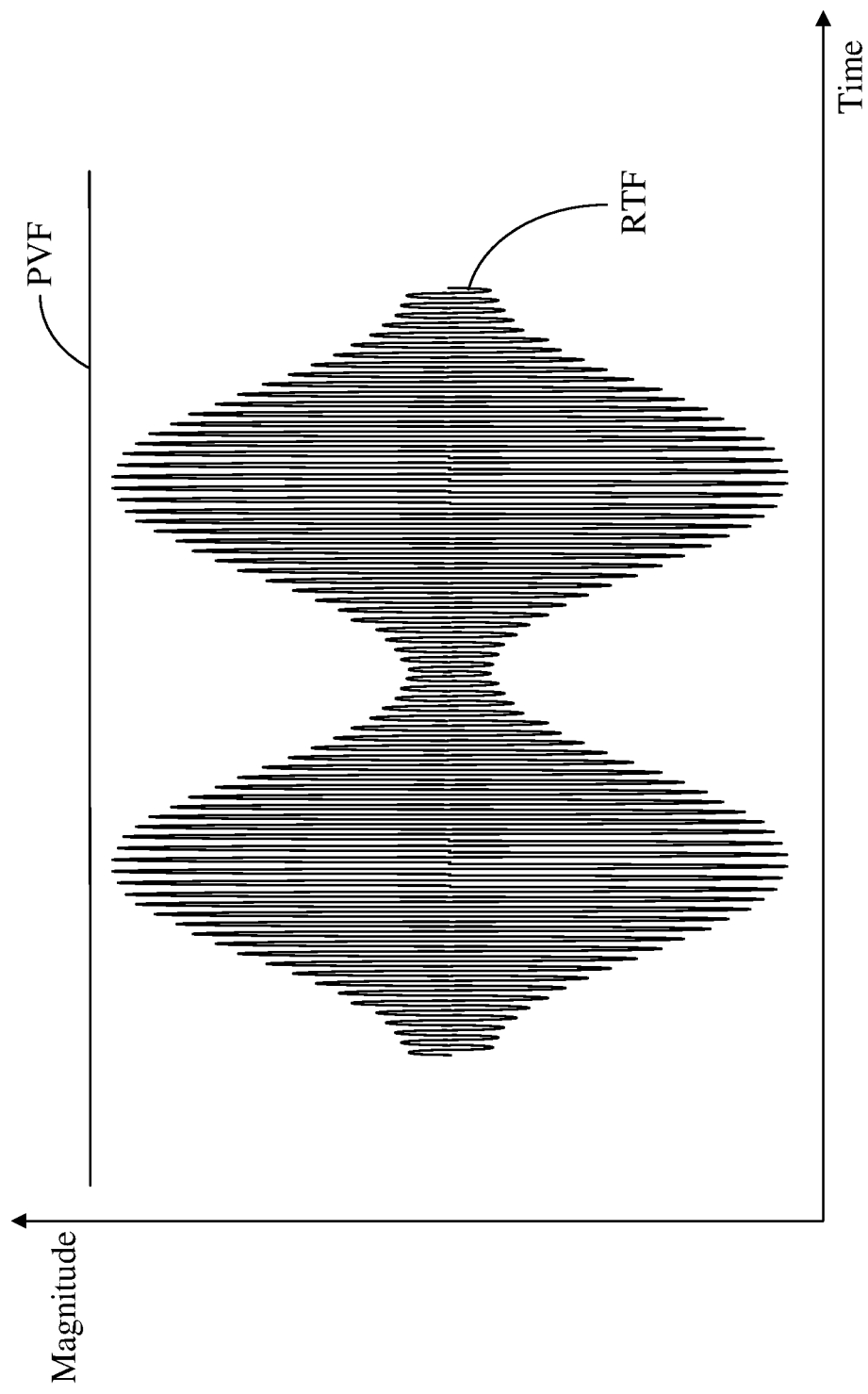
FIG. 6 is a graph illustrating the first RF transmit signal and the first PA power supply voltage of the RF communications system shown in FIG. 1 during average power tracking, according to an alternate embodiment of the RF communications system.

In one embodiment of the first RF input signal RNF, the first RF input signal RNF is amplitude modulated. As such, the first RF transmit signal RTF is also amplitude modulated, as illustrated in FIG. 5. Since the amplitude of the first RF transmit signal RTF is modulated, the amplitude of the first RF transmit signal RTF traverses within an envelope of the first RF transmit signal RTF. In one embodiment of the PA power supply 28, for proper operation of the first RF PA 24, the first PA power supply voltage PVF (FIGS. 1, 5, and 6) must be high enough to accommodate the envelope of the first RF transmit signal RTF (FIGS. 5 and 6). However, to increase efficiency in the first RF PA 24, the first PA power supply voltage PVF (FIGS. 1 and 5) may at least partially track the envelope of the first RF transmit signal RTF (FIG. 5). This tracking by the first PA power supply voltage PVF (FIGS. 1 and 5) is called envelope tracking.

In one embodiment of the PA power supply 28, the first PA power supply voltage PVF (FIGS. 1 and 6) is high enough to accommodate the envelope of the first RF transmit signal RTF (FIG. 6). However, the first PA power supply voltage PVF (FIGS. 1 and 6) does not significantly track the envelope of the first RF transmit signal RTF (FIG. 6). The lack of envelope tracking but providing enough magnitude to accommodate the envelope of the first RF transmit signal RTF (FIG. 6) is called average power tracking.

In a first embodiment of the first PA power supply signal PAF, during envelope tracking, a bandwidth of the first PA power supply signal PAF is greater than 10 megahertz. In a second embodiment of the first PA power supply signal PAF, during envelope tracking, the bandwidth of the first PA power supply signal PAF is greater than 15 megahertz. In a third embodiment of the first PA power supply signal PAF, during envelope tracking, the bandwidth of the first PA power supply signal PAF is greater than 20 megahertz. In a fourth embodiment of the first PA power supply signal PAF, during envelope tracking, a bandwidth of the first PA power supply signal PAF is greater than 25 megahertz. In a fifth embodiment of the first PA power supply signal PAF, during envelope tracking, a bandwidth of the first PA power supply signal PAF is greater than 30 megahertz.

In a sixth embodiment of the first PA power supply signal PAF, during envelope tracking, a bandwidth of the first PA power supply signal PAF is greater than 35 megahertz. In a seventh embodiment of the first PA power supply signal PAF, during envelope tracking, a bandwidth of the first PA power supply signal PAF is greater than 40 megahertz. In an eighth embodiment of the first PA power supply signal PAF, during envelope tracking, a bandwidth of the first PA power supply signal PAF is greater than 50 megahertz. In a ninth embodiment of the first PA power supply signal PAF, during envelope tracking, a bandwidth of the first PA power supply signal PAF is greater than 60 megahertz. In a tenth embodiment of the first PA power supply signal PAF, during envelope tracking, a bandwidth of the first PA power supply signal PAF is less than 100 megahertz.

In a first embodiment of the second PA power supply signal PAS, during envelope tracking, a bandwidth of the second PA power supply signal PAS is greater than 10 megahertz. In a second embodiment of the second PA power supply signal PAS, during envelope tracking, the bandwidth of the second PA power supply signal PAS is greater than 15 megahertz. In a third embodiment of the second PA power supply signal PAS, during envelope tracking, the bandwidth of the second PA power supply signal PAS is greater than 20 megahertz. In a fourth embodiment of the second PA power supply signal PAS, during envelope tracking, a bandwidth of the second PA power supply signal PAS is greater than 25 megahertz. In a fifth embodiment of the second PA power supply signal PAS, during envelope tracking, a bandwidth of the second PA power supply signal PAS is greater than 30 megahertz.

In a sixth embodiment of the second PA power supply signal PAS, during envelope tracking, a bandwidth of the second PA power supply signal PAS is greater than 35 megahertz. In a seventh embodiment of the second PA power supply signal PAS, during envelope tracking, a bandwidth of the second PA power supply signal PAS is greater than 40 megahertz. In an eighth embodiment of the second PA power supply signal PAS, during envelope tracking, a bandwidth of the second PA power supply signal PAS is greater than 50 megahertz. In a ninth embodiment of the second PA power supply signal PAS, during envelope tracking, a bandwidth of the second PA power supply signal PAS is greater than 60 megahertz. In a tenth embodiment of the second PA power supply signal PAS, during envelope tracking, a bandwidth of the second PA power supply signal PAS is less than 100 megahertz.

In a first embodiment of the third PA power supply signal PAT, during envelope tracking, a bandwidth of the third PA power supply signal PAT is greater than 10 megahertz. In a second embodiment of the third PA power supply signal PAT, during envelope tracking, the bandwidth of the third PA power supply signal PAT is greater than 15 megahertz. In a third embodiment of the third PA power supply signal PAT, during envelope tracking, the bandwidth of the third PA power supply signal PAT is greater than 20 megahertz. In a fourth embodiment of the third PA power supply signal PAT, during envelope tracking, a bandwidth of the third PA power supply signal PAT is greater than 25 megahertz. In a fifth embodiment of the third PA power supply signal PAT, during envelope tracking, a bandwidth of the third PA power supply signal PAT is greater than 30 megahertz.

In a sixth embodiment of the third PA power supply signal PAT, during envelope tracking, a bandwidth of the third PA power supply signal PAT is greater than 35 megahertz. In a seventh embodiment of the third PA power supply signal PAT, during envelope tracking, a bandwidth of the third PA power supply signal PAT is greater than 40 megahertz. In an eighth embodiment of the third PA power supply signal PAT, during envelope tracking, a bandwidth of the third PA power supply signal PAT is greater than 50 megahertz. In a ninth embodiment of the third PA power supply signal PAT, during envelope tracking, a bandwidth of the third PA power supply signal PAT is greater than 60 megahertz. In a tenth embodiment of the third PA power supply signal PAT, during envelope tracking, a bandwidth of the third PA power supply signal PAT is less than 100 megahertz.

Figure 3:
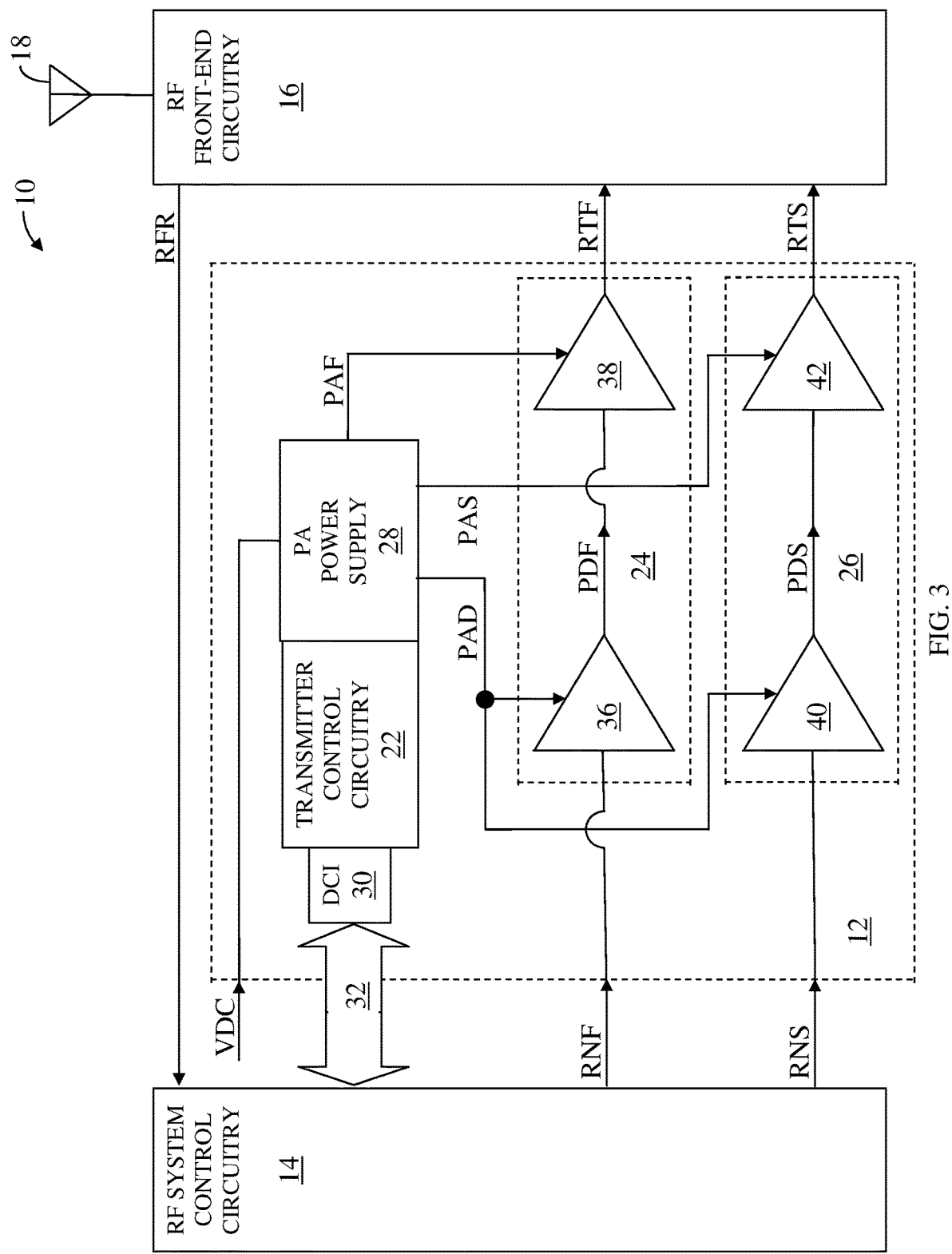
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 2, except in the RF communications system 10 illustrated in FIG. 3, the third RF PA 34 is omitted and details of the first RF PA 24 and the second RF PA 26 are shown.

The first RF PA 24 includes a first driver stage 36 and a first final stage 38. The second RF PA 26 includes a second driver stage 40 and a second final stage 42. The PA power supply 28 provides the first PA power supply signal PAF to the first final stage 38 and the second PA power supply signal PAS to the second final stage 42. Further, the PA power supply 28 provides a PA driver stage power supply signal PAD to the first driver stage 36 and the second driver stage 40.

The first driver stage 36 receives and amplifies the first RF input signal RNF to provide a first driver stage output signal PDF using the PA driver stage power supply signal PAD. The first final stage 38 receives and amplifies the first driver stage output signal PDF to provide the first RF transmit signal RTF using the first PA power supply signal PAF.

The second driver stage 40 receives and amplifies the second RF input signal RNS to provide a second driver stage output signal PDS using the PA driver stage power supply signal PAD. The second final stage 42 receives and amplifies the second driver stage output signal PDS to provide the second RF transmit signal RTS using the second PA power supply signal PAS.

Figure 4:
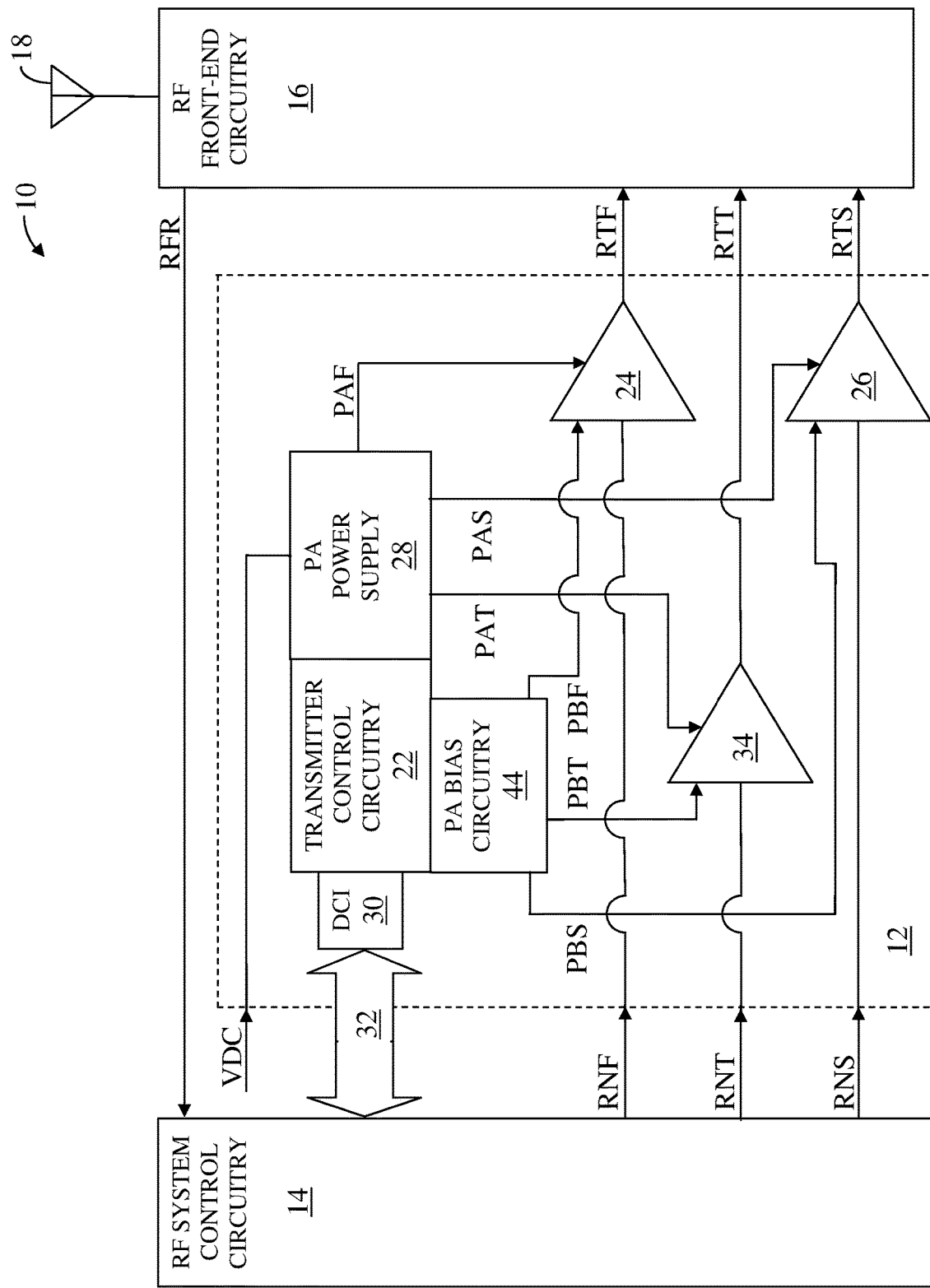
FIG. 4 shows the RF communications system according to another embodiment of the RF communications system.

FIG. 4 shows the RF communications system 10 according to another additional embodiment of the RF communications system 10. The RF communications system 10 illustrated in FIG. 4 is similar to the RF communications system 10 illustrated in FIG. 2, except in the RF communications system 10 illustrated in FIG. 4, the RF transmitter circuitry 12 further includes PA bias circuitry 44, which is coupled to the transmitter control circuitry 22.

The PA bias circuitry 44 provides a first PA bias control signal PBF to the first RF PA 24, a second PA bias control signal PBS to the second RF PA 26, and a third PA bias control signal PBT to the third RF PA 34. As such, the PA bias circuitry 44 controls a bias of the first RF PA 24 using the first PA bias control signal PBF. The PA bias circuitry 44 controls a bias of the second RF PA 26 using the second PA bias control signal PBS. The PA bias circuitry 44 controls a bias of the third RF PA 34 using the third PA bias control signal PBT.

In one embodiment of the PA bias circuitry 44, the PA bias circuitry 44 controls any or all of the first PA bias control signal PBF, the second PA bias control signal PBS, and the third PA bias control signal PBT based on the transmitter configuration signal PACS (FIG. 1). In one embodiment of the PA bias circuitry 44, the PA bias circuitry 44 disables the first RF PA 24 using the first PA bias control signal PBF. In one embodiment of the PA bias circuitry 44, the PA bias circuitry 44 disables the second RF PA 26 using the second PA bias control signal PBS. In one embodiment of the PA bias circuitry 44, the PA bias circuitry 44 disables the third RF PA 34 using the third PA bias control signal PBT.

In an alternate embodiment of the RF transmitter circuitry 12, any or all of the first PA bias control signal PBF, the second PA bias control signal PBS, and the third PA bias control signal PBT are omitted. In another embodiment of the RF transmitter circuitry 12, any or all of the first RF PA 24, the second RF PA 26, and the third RF PA 34 are omitted.

FIG. 5 is a graph illustrating the first RF transmit signal RTF and the first PA power supply voltage PVF of the RF communications system 10 shown in FIG. 1 during envelope tracking, according to one embodiment of the RF communications system 10. FIG. 6 is a graph illustrating the first RF transmit signal RTF and the first PA power supply voltage PVF of the RF communications system 10 shown in FIG. 1 during average power tracking, according to an alternate embodiment of the RF communications system 10.

Figure 7:
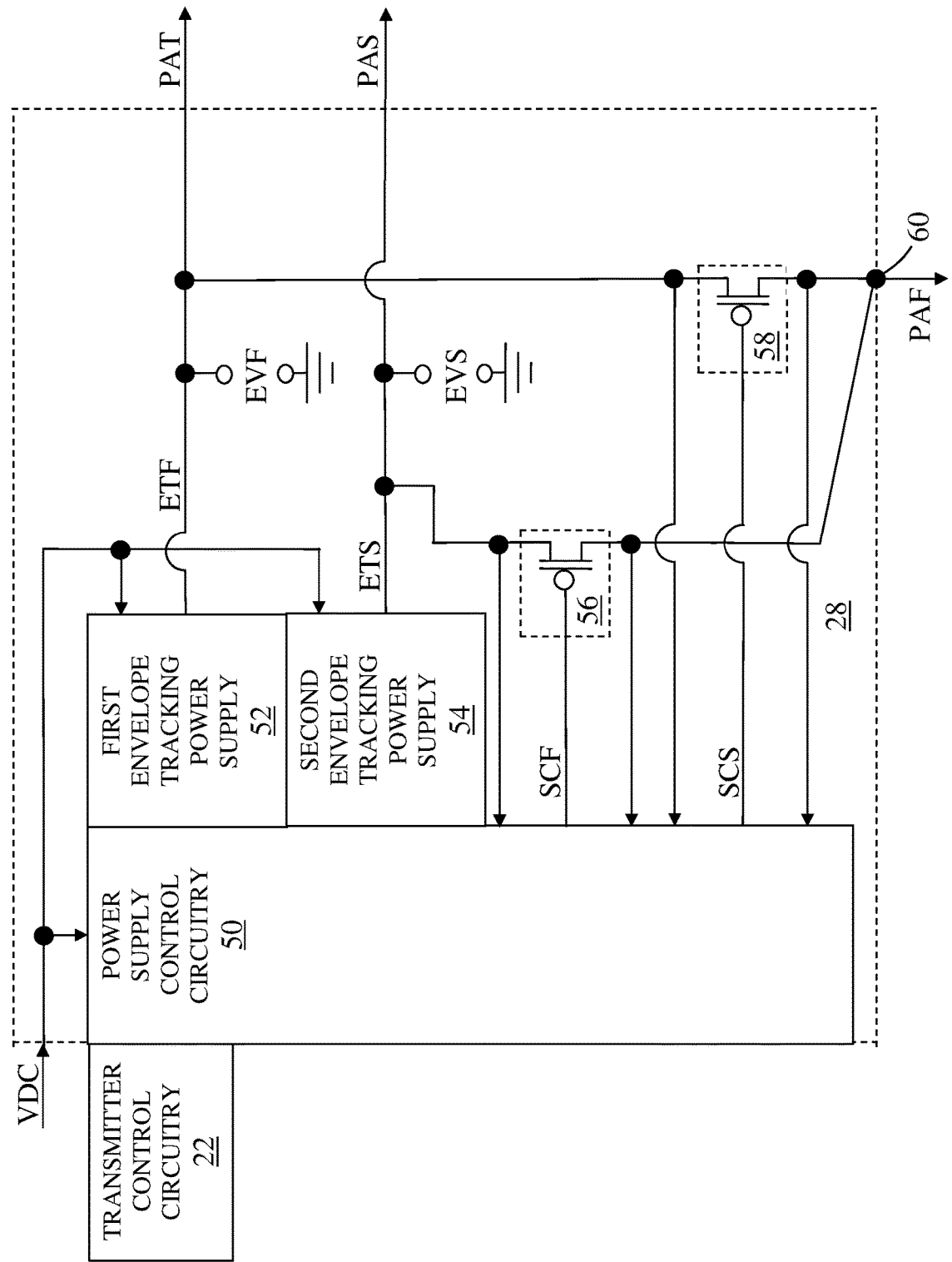
FIG. 7 shows transmitter control circuitry and details of a PA power supply illustrated in FIG. 2 according to one embodiment of the transmitter control circuitry and the PA power supply.

FIG. 7 shows the transmitter control circuitry 22 and details of the PA power supply 28 illustrated in FIG. 2 according to one embodiment of the transmitter control circuitry 22 and the PA power supply 28. The PA power supply 28 includes power supply control circuitry 50, a first envelope tracking power supply 52, a second envelope tracking power supply 54, a first PMOS switching element 56, and a second PMOS switching element 58. In addition, the PA power supply 28 has a first PA connection node 60. The transmitter control circuitry 22 is coupled to the power supply control circuitry 50. As such, the transmitter control circuitry 22 and the power supply control circuitry 50 exchange information, as needed, to provide proper operation of the PA power supply 28.

The first PMOS switching element 56 is coupled between the second envelope tracking power supply 54 and the first PA connection node 60. The second PMOS switching element 58 is coupled between the first envelope tracking power supply 52 and the first PA connection node 60. In general, the first PMOS switching element 56 is coupled to the first PA connection node 60. The power supply control circuitry 50, the first envelope tracking power supply 52, and the second envelope tracking power supply 54 each receive the DC source signal VDC from the DC power source 20 (FIG. 1). In this regard, the DC power source 20 (FIG. 1) provides power to the power supply control circuitry 50, the first envelope tracking power supply 52, and the second envelope tracking power supply 54 using the DC source signal VDC.

The first envelope tracking power supply 52 provides a first ET power supply signal ETF, which provides the third PA power supply signal PAT based on a setpoint of the third PA power supply signal PAT. The second envelope tracking power supply 54 provides a second ET power supply signal ETS, which provides the second PA power supply signal PAS based on a setpoint of the second PA power supply signal PAS. The first ET power supply signal ETF has a first ET voltage EVF and the second ET power supply signal ETS has a second ET voltage EVS. The first ET power supply signal ETF and the second ET power supply signal ETS are fed back to the power supply control circuitry 50.

In one embodiment of the PA power supply 28, the PA power supply 28 operates in one of a group of operating modes. During a first operating mode of the group of operating modes, the PA power supply 28 provides the first PA power supply signal PAF via the first PA connection node 60. Further, during the first operating mode, the power supply control circuitry 50 selects an OFF state of the first PMOS switching element 56 using a first switch control signal SCF and adjusts a voltage of the first switch control signal SCF to maintain the OFF state of the first PMOS switching element 56 using a voltage at a source of the first PMOS switching element 56 and a voltage at a drain of the first PMOS switching element 56.

In this regard, in one embodiment of the first PMOS switching element 56, the first PMOS switching element 56 is a symmetrical device, such that either end of the first PMOS switching element 56 may function as the source of the first PMOS switching element 56 and an opposite end of the first PMOS switching element 56 may function as the drain of the first PMOS switching element 56, depending on which end of the first PMOS switching element 56 has a higher voltage. The end that has the higher voltage functions as the source and an opposite end functions as the drain. In this regard, both ends of the first PMOS switching element 56 are coupled to the power supply control circuitry 50.

In one embodiment of the PA power supply 28, during the first operating mode, the power supply control circuitry 50 selects an ON state of the second PMOS switching element 58 using a second switch control signal SCS. Since the second PMOS switching element 58 is ON during the first operating mode, the first envelope tracking power supply 52 provides the first ET power supply signal ETF, such that the first PA power supply signal PAF is based on the first ET power supply signal ETF.

In one embodiment of the PA power supply 28, a propagation delay in transitioning the first PMOS switching element 56 from an ON state to an OFF state is less than eight nanoseconds. In one embodiment of the PA power supply 28, during the first operating mode, a bandwidth of the first PA power supply signal PAF is greater than 15 megahertz.

In one embodiment of the PA power supply 28, during the first operating mode, the power supply control circuitry 50 adjusts the voltage of the first switch control signal SCF to maintain the OFF state of the first PMOS switching element 56 using a highest one of the voltage at the source of the first PMOS switching element 56 and the voltage at the drain of the first PMOS switching element 56.

In one embodiment of the PA power supply 28, during the first operating mode, the power supply control circuitry 50 adjusts the voltage of the first switch control signal SCF to maintain the OFF state of the first PMOS switching element 56 using a highest one of the voltage at the source of the first PMOS switching element 56, the voltage at the drain of the first PMOS switching element 56, and the DC source voltage DCV (FIG. 1).

In one embodiment of the PA power supply 28, during the first operating mode, the power supply control circuitry 50 selects an ON state of the second PMOS switching element 58 using the second switch control signal SCS; the first envelope tracking power supply 52 provides the first ET power supply signal ETF, such that the first PA power supply signal PAF is based on the first ET power supply signal ETF; and the second envelope tracking power supply 54 provides the second ET power supply signal ETS, such that the second PA power supply signal PAS is based on the second ET power supply signal ETS.

In a general embodiment of the PA power supply 28, the first PMOS switching element 56 is replaced with a first MOS switching element and the second PMOS switching element 58 is replaced with a second MOS switching element. In this regard, the first MOS switching element is coupled between the second envelope tracking power supply 54 and the first PA connection node 60. The second MOS switching element is coupled between the first envelope tracking power supply 52 and the first PA connection node 60.

During the first operating mode, the power supply control circuitry 50 selects an OFF state of the first MOS switching element using the first switch control signal SCF and adjusts a voltage of the first switch control signal SCF to maintain the OFF state of the first MOS switching element using a voltage at a source of the first MOS switching element and a voltage at a drain of the first MOS switching element. Additionally, during the first operating mode, the power supply control circuitry 50 selects an ON state of the second MOS switching element using the second switch control signal SCS.

Figure 8:
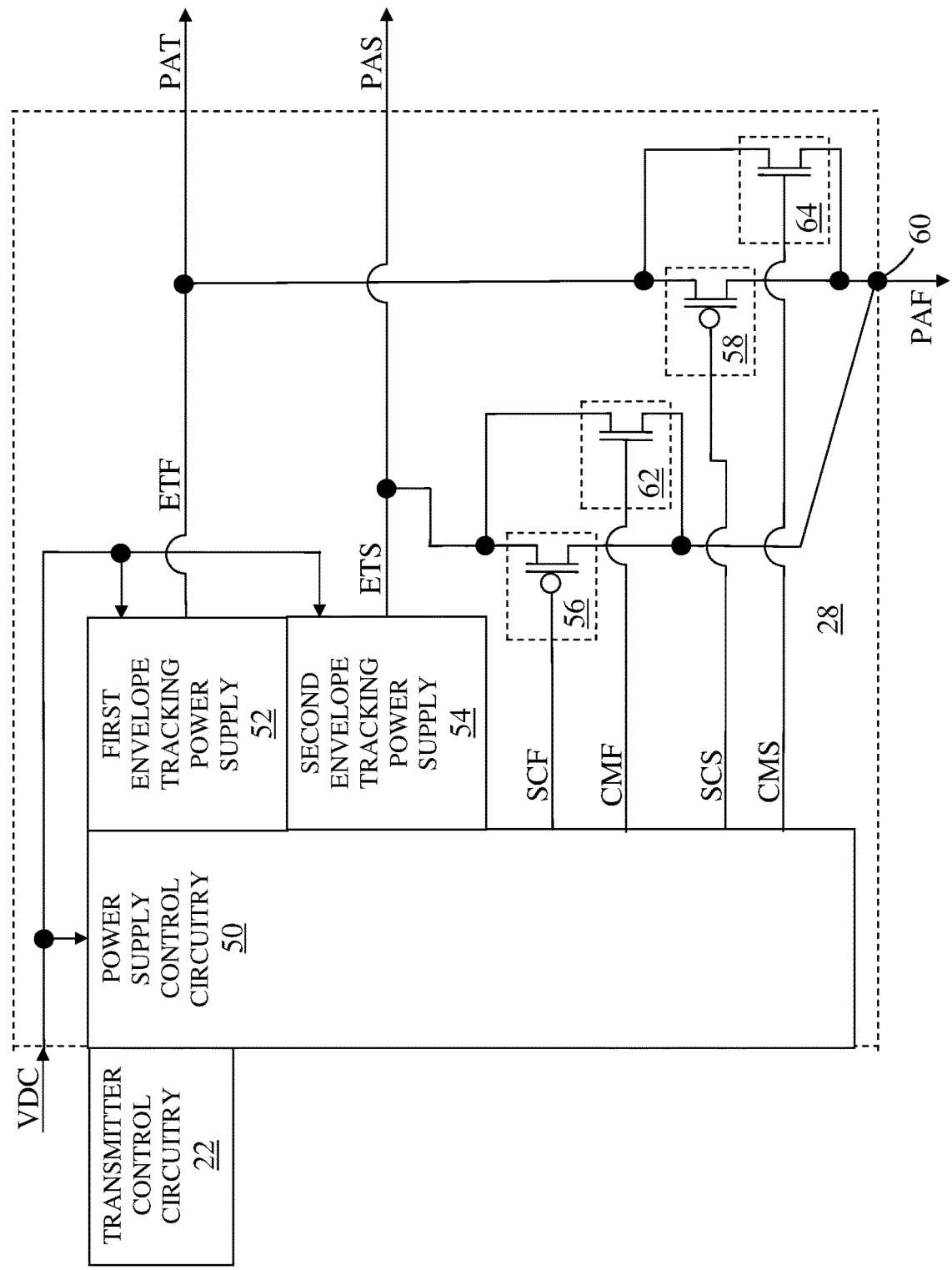
FIG. 8 shows the transmitter control circuitry and details of the PA power supply illustrated in FIG. 2 according to one embodiment of the transmitter control circuitry and the PA power supply.

FIG. 8 shows the transmitter control circuitry 22 and details of the PA power supply 28 illustrated in FIG. 2 according to one embodiment of the transmitter control circuitry 22 and the PA power supply 28. The PA power supply 28 illustrated in FIG. 8 is similar to the PA power supply 28 illustrated in FIG. 7, except the PA power supply 28 illustrated in FIG. 8 further includes a first NMOS switching element 62 and a second NMOS switching element 64.

The first NMOS switching element 62 is coupled across the first PMOS switching element 56 and the second NMOS switching element 64 is coupled across the second PMOS switching element 58. During the first operating mode, the power supply control circuitry 50 selects an OFF state of the first NMOS switching element 62 using a first NMOS switch control signal CMF and selects an ON state of the second NMOS switching element 64 using a second NMOS switch control signal CMS, such that the second NMOS switching element 64 assists the second PMOS switching element 58.

During the second operating mode, the power supply control circuitry 50 selects an ON state of the first NMOS switching element 62 using the first NMOS switch control signal CMF and selects an OFF state of the second NMOS switching element 64 using the second NMOS switch control signal CMS, such that the first NMOS switching element 62 assists the first PMOS switching element 56.

Figure 9:
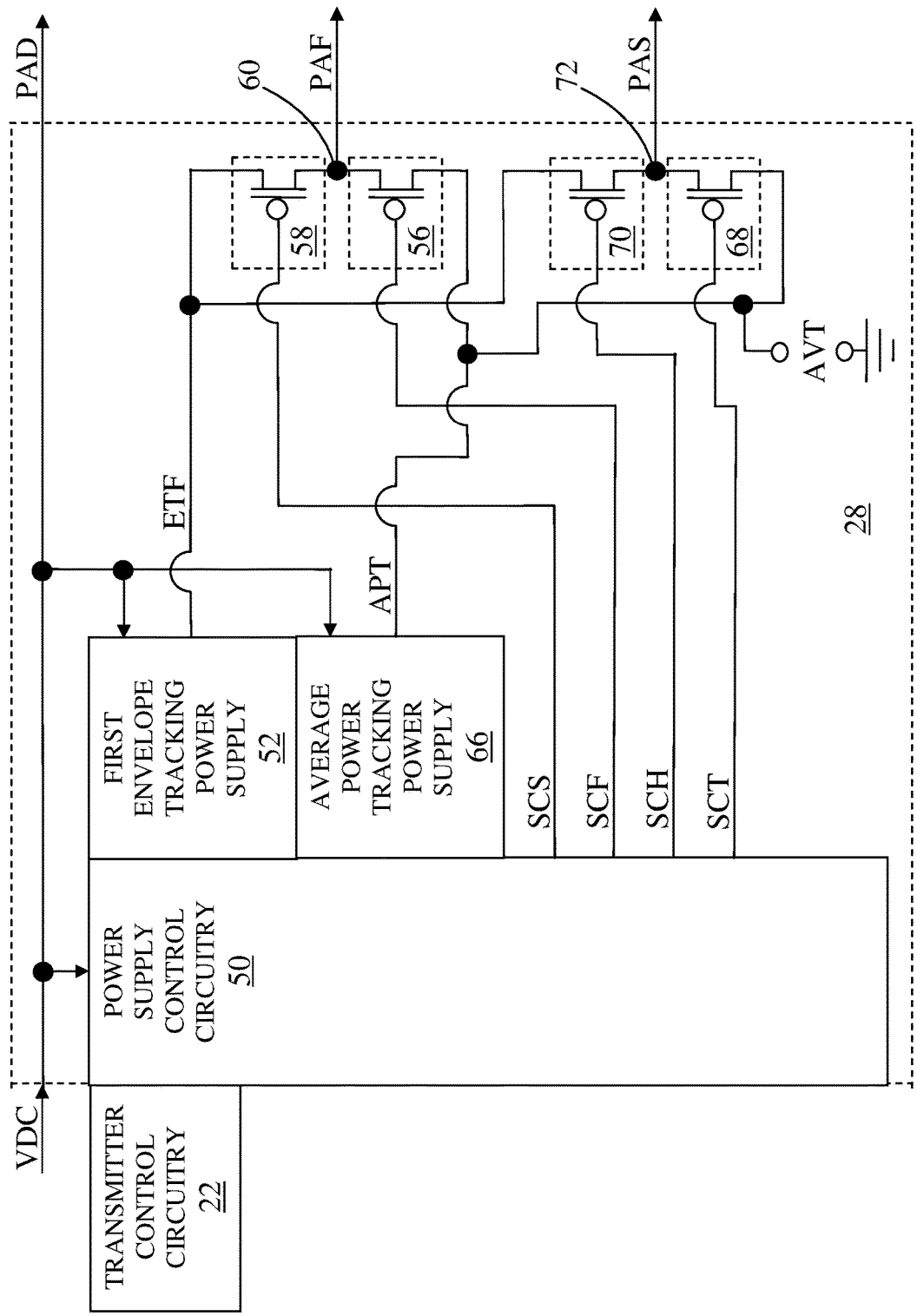
FIG. 9 shows the transmitter control circuitry and details of the PA power supply illustrated in FIG. 3 according to one embodiment of the transmitter control circuitry and the PA power supply.

FIG. 9 shows the transmitter control circuitry 22 and details of the PA power supply 28 illustrated in FIG. 3 according to one embodiment of the transmitter control circuitry 22 and the PA power supply 28. The PA power supply 28 illustrated in FIG. 9 is similar to the PA power supply 28 illustrated in FIG. 7, except in the PA power supply 28 illustrated in FIG. 9, the second envelope tracking power supply 54 is replaced with an average power tracking power supply 66. The average power tracking power supply 66 provides an average power tracking power supply signal APT, which has an average power tracking voltage AVT. Additionally, the PA power supply 28 further includes a third PMOS switching element 68 and a fourth PMOS switching element 70, and has a second PA connection node 72.

The first PMOS switching element 56 is coupled between the average power tracking power supply 66 and the first PA connection node 60. The third PMOS switching element 68 is coupled between the average power tracking power supply 66 and the second PA connection node 72. The fourth PMOS switching element 70 is coupled between the first envelope tracking power supply 52 and the second PA connection node 72. During the first operating mode, the average power tracking power supply 66 provides the average power tracking power supply signal APT, such that the second PA power supply signal PAS is based on the average power tracking power supply signal APT. During the first operating mode, the power supply control circuitry 50 selects an ON state of the third PMOS switching element 68 using a third switch control signal SCT and further selects an OFF state of the fourth PMOS switching element 70 using a fourth switch control signal SCH.

During the second operating mode, the power supply control circuitry 50 selects the ON state of the first PMOS switching element 56 using the first switch control signal SCF, selects the OFF state of the second PMOS switching element 58 using the second switch control signal SCS, selects an OFF state of the third PMOS switching element 68 using the third switch control signal SCT, and selects an ON state of the fourth PMOS switching element 70 using the fourth switch control signal SCH. During the second operating mode, the first PA power supply signal PAF is based on the average power tracking power supply signal APT and the second PA power supply signal PAS is based on the first ET power supply signal ETF.

Figure 10:
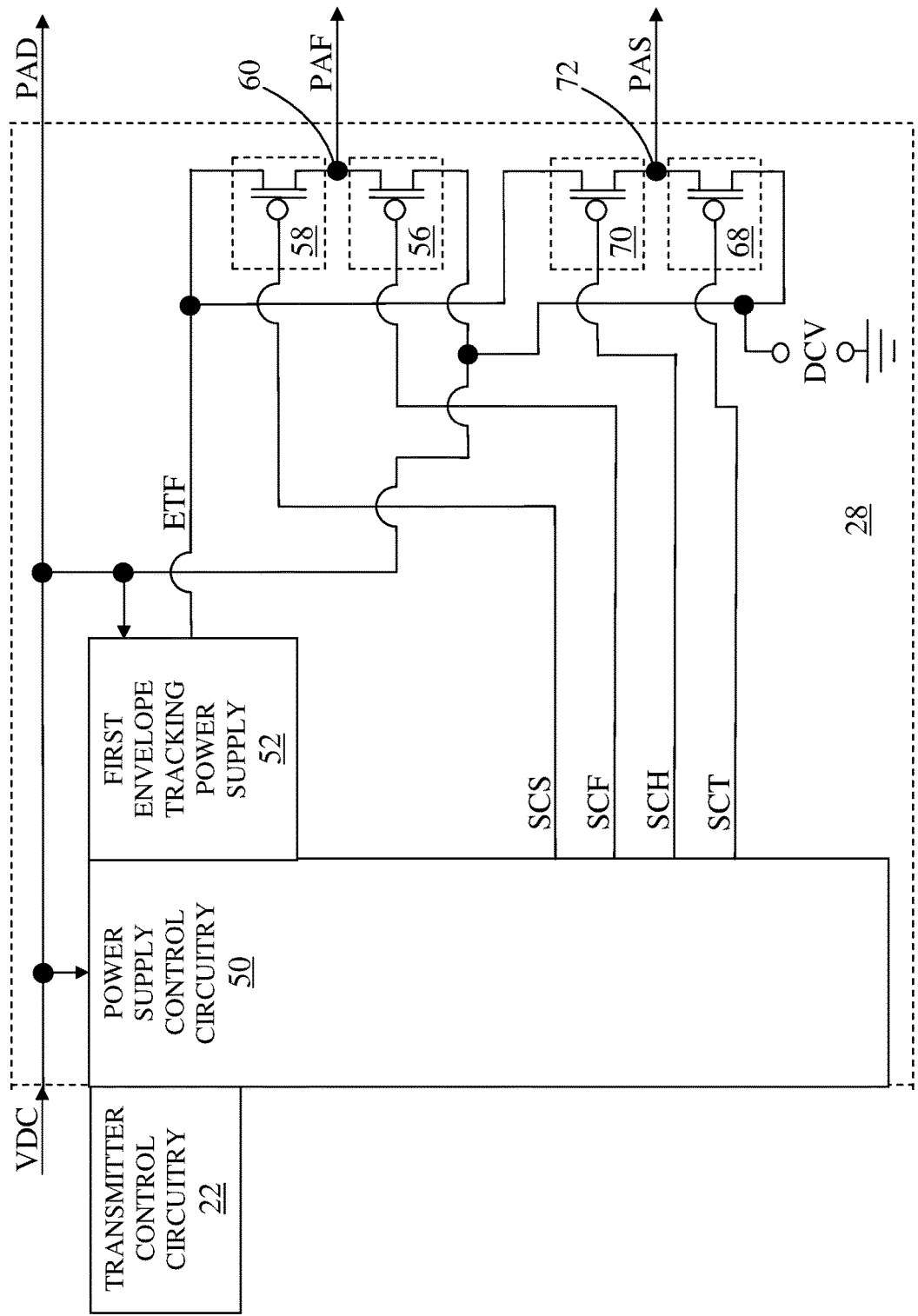
FIG. 10 shows the transmitter control circuitry and details of the PA power supply illustrated in FIG. 3 according to an alternate embodiment of the transmitter control circuitry and the PA power supply.

FIG. 10 shows the transmitter control circuitry 22 and details of the PA power supply 28 illustrated in FIG. 3 according to an alternate embodiment of the transmitter control circuitry 22 and the PA power supply 28. The PA power supply 28 illustrated in FIG. 10 is similar to the PA power supply 28 illustrated in FIG. 9, except in the PA power supply 28 illustrated in FIG. 10, the average power tracking power supply 66 is omitted.

In this regard, the first PMOS switching element 56 is coupled between the DC power source 20 (FIG. 1) and the first PA connection node 60. As such, the DC power source 20 (FIG. 1) provides the DC source signal VDC. The third PMOS switching element 68 is coupled between the DC power source 20 (FIG. 1) and the second PA connection node 72. During the first operating mode, the second PA power supply signal PAS is based on the DC source signal VDC.

During the second operating mode, the first PA power supply signal PAF is based on the DC source signal VDC and the second PA power supply signal PAS is based on the first ET power supply signal ETF. In one embodiment of the PA power supply 28, during the second operating mode, the power supply control circuitry 50 adjusts a voltage of the second switch control signal SCS to maintain the OFF state of the second PMOS switching element 58 using a highest one of a voltage at a source of the second PMOS switching element 58, a voltage at a drain of the second PMOS switching element 58, and the DC source voltage DCV. Additionally, during the second operating mode, the power supply control circuitry 50 adjusts a voltage of the third switch control signal SCT to maintain the OFF state of the third PMOS switching element 68 using a highest one of a voltage at a source of the third PMOS switching element 68, a voltage at a drain of the third PMOS switching element 68, and the DC source voltage DCV.

Figure 11:
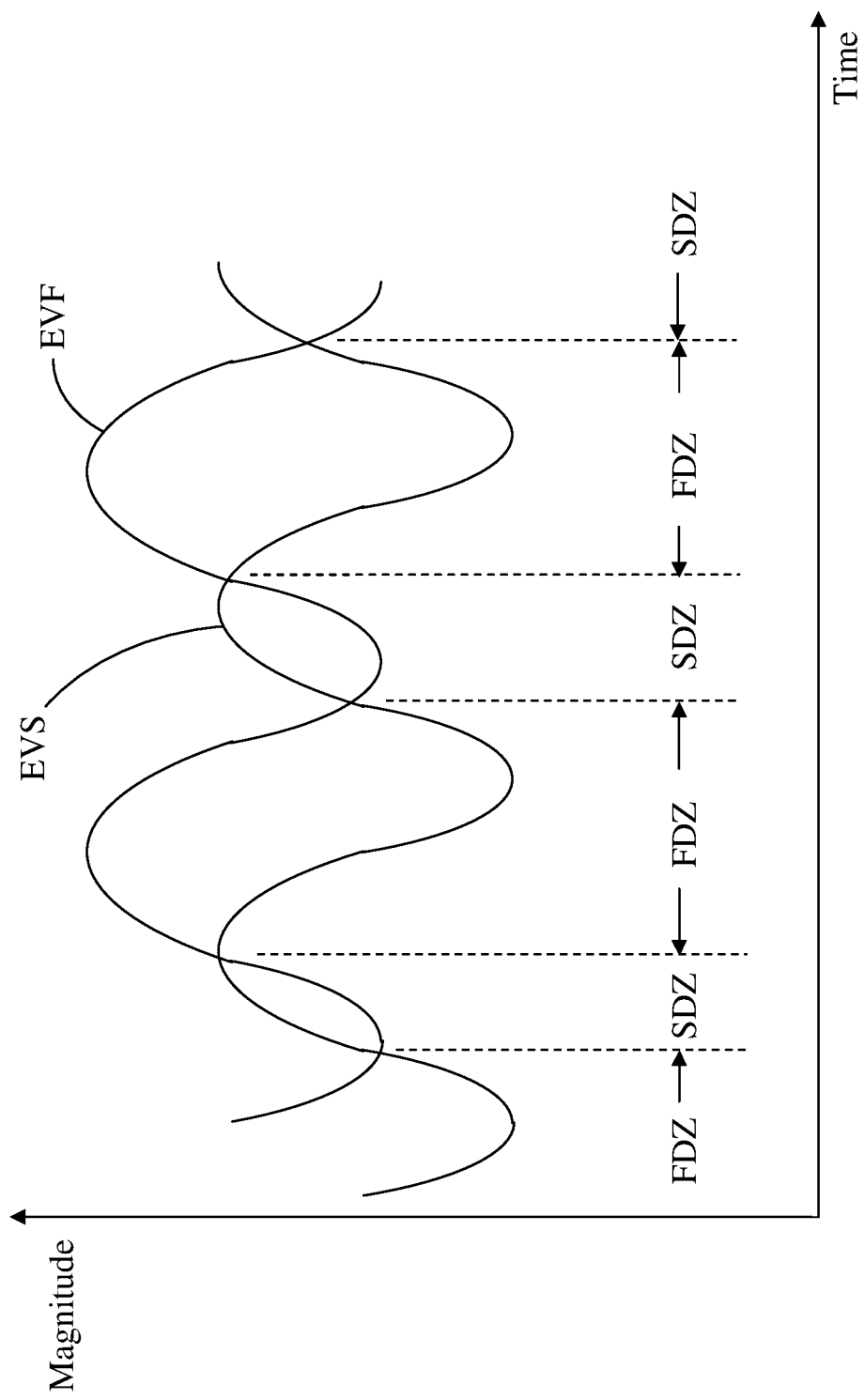
FIG. 11 is a graph illustrating a first ET voltage and a second ET voltage shown in FIG. 7 according to one embodiment of the first ET voltage and the second ET voltage.

FIG. 11 is a graph illustrating the first ET voltage EVF and the second ET voltage EVS shown in FIG. 7 according to one embodiment of the first ET voltage EVF and the second ET voltage EVS. A first dominant zone FDZ occurs when the first ET voltage EVF is higher than the second ET voltage EVS. A second dominant zone SDZ occurs when the second ET voltage EVS is higher than the first ET voltage EVF. In this regard, continuous adjusts may be required to the first switch control signal SCF (FIG. 7) and the second switch control signal SCS (FIG. 7).

Figure 12:
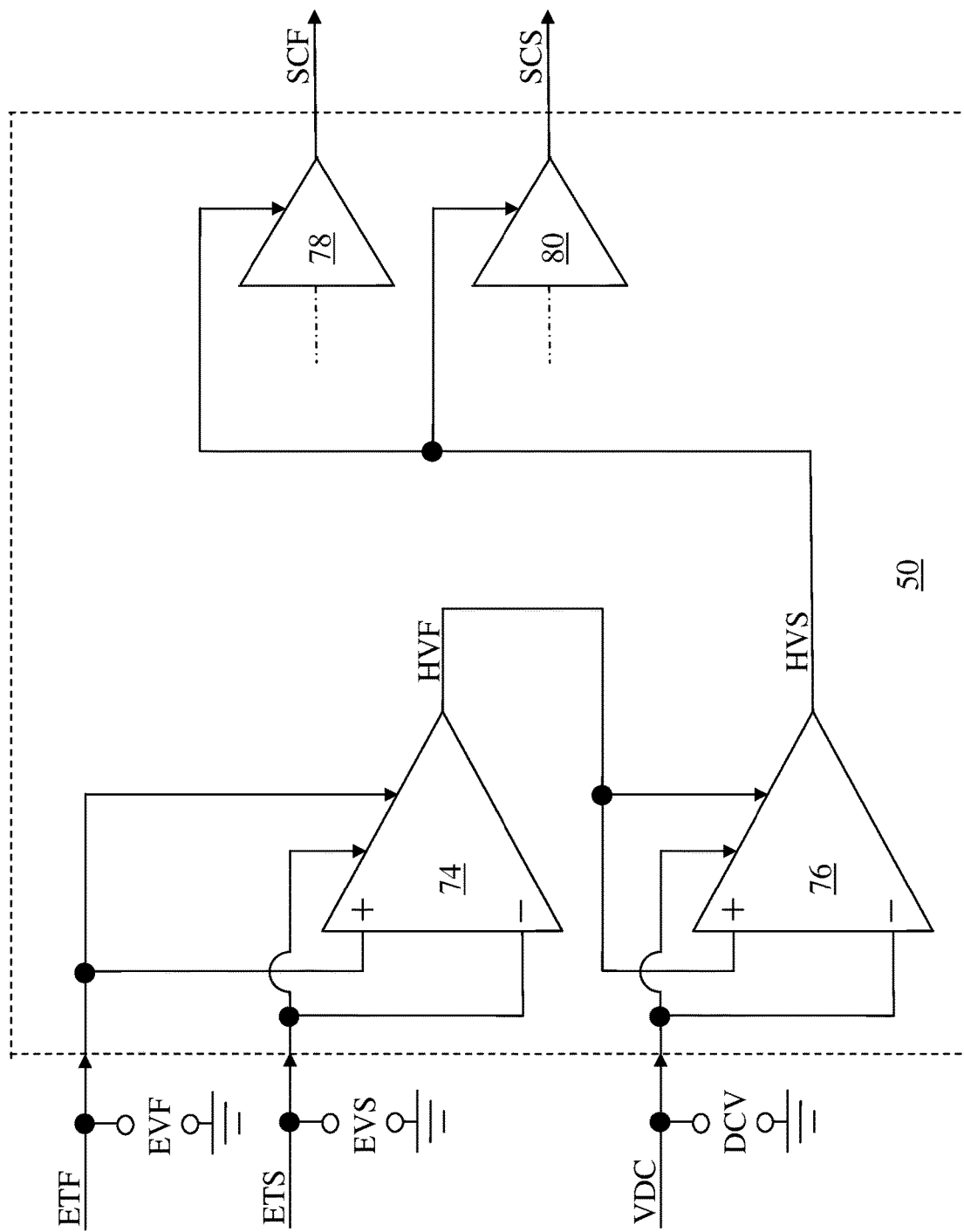
FIG. 12 shows details of the power supply control circuitry illustrated in FIG. 7 according to one embodiment of the power supply control circuitry.

FIG. 12 shows details of the power supply control circuitry 50 illustrated in FIG. 7 according to one embodiment of the power supply control circuitry 50. The power supply control circuitry 50 includes a first highest voltage extraction circuit 74, a second highest voltage extraction circuit 76, a first switch control driver 78, and a second switch control driver 80. An input to the first highest voltage extraction circuit 74 receives the first ET power supply signal ETF, which has the first ET voltage EVF. Another input to the first highest voltage extraction circuit 74 receives the second ET power supply signal ETS, which has the second ET voltage EVS. The first highest voltage extraction circuit 74 provides a first highest voltage signal HVF, which is representative of the higher of the first ET voltage EVF and the second ET voltage EVS.

An input to the second highest voltage extraction circuit 76 receives the DC source signal VDC, which has the DC source voltage DCV. Another input to the second highest voltage extraction circuit 76 receives the first highest voltage signal HVF. The second highest voltage extraction circuit 76 provides a second highest voltage signal HVS, which is representative of the higher of the DC source voltage DCV and the voltage represented by the first highest voltage signal HVF. As such, the second highest voltage signal HVS is representative of the highest of the first ET voltage EVF, the second ET voltage EVS, and the DC source voltage DCV. In one embodiment of the second highest voltage signal HVS, the second highest voltage signal HVS has a voltage that is the highest of the first ET voltage EVF, the second ET voltage EVS, and the DC source voltage DCV.

By using the second highest voltage signal HVS, when the first PMOS switching element 56 (FIG. 7), the second PMOS switching element 58 (FIG. 7), or both are selected to be in the OFF state, the second highest voltage signal HVS provides adequate positive voltage to make sure the OFF state is selected.

Figure 13:
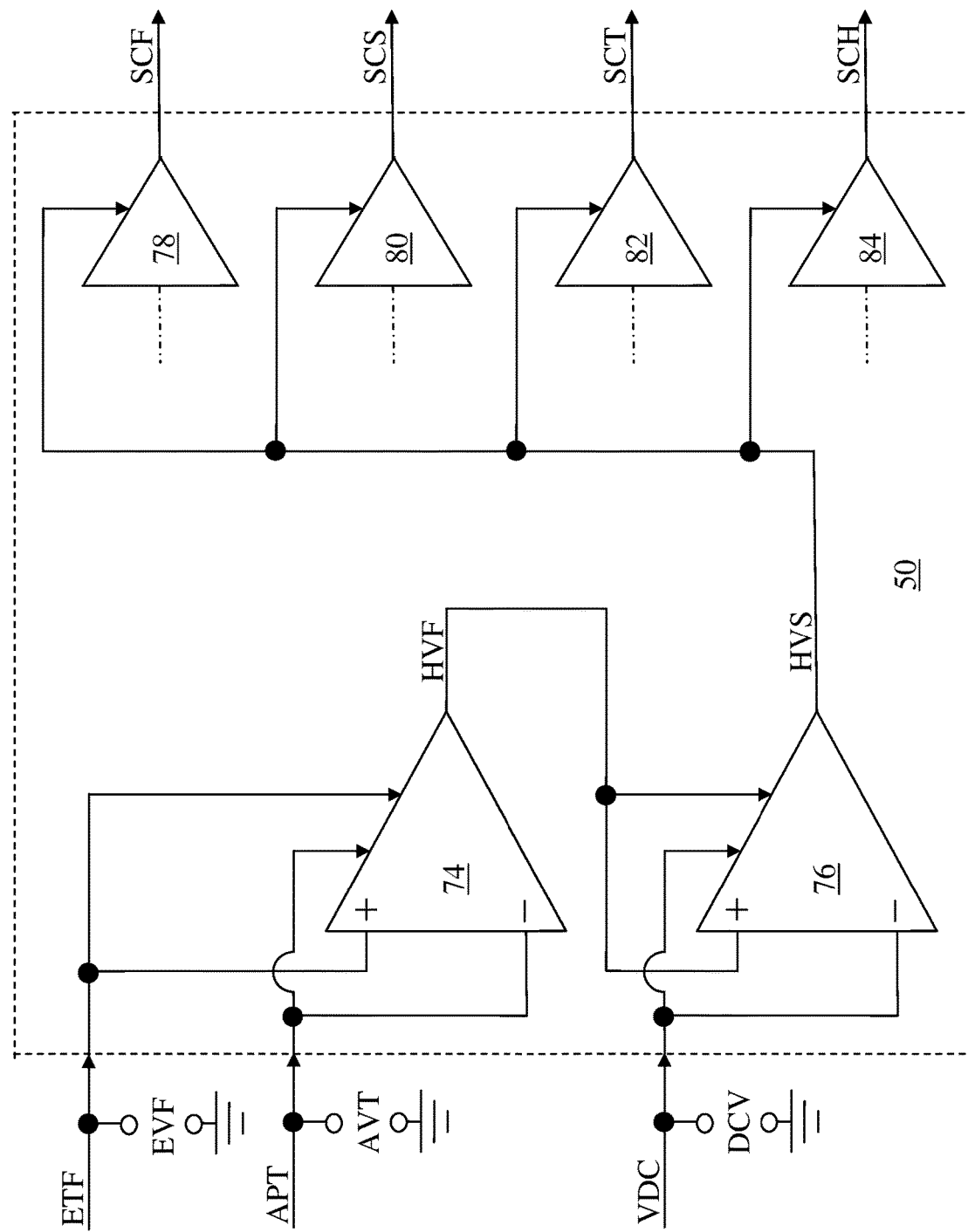
FIG. 13 shows details of the power supply control circuitry illustrated in FIG. 9 according to one embodiment of the power supply control circuitry.

FIG. 13 shows details of the power supply control circuitry 50 illustrated in FIG. 9 according to one embodiment of the power supply control circuitry 50. The power supply control circuitry 50 illustrated in FIG. 13 is similar to the power supply control circuitry 50 illustrated in FIG. 12, except in the power supply control circuitry 50 illustrated in FIG. 13, the power supply control circuitry 50 further includes a third switch control driver 82 and a fourth switch control driver 84. Both the third switch control driver 82 and the fourth switch control driver 84 receive the second highest voltage signal HVS.

Additionally, the first highest voltage extraction circuit 74 receives the average power tracking power supply signal APT, which has the average power tracking voltage AVT, instead of receiving the second ET power supply signal ETS. The third switch control driver 82 provides the third switch control signal SCT and the fourth switch control driver 84 provides the fourth switch control signal SCH. In this regard, the first highest voltage extraction circuit 74 provides the first highest voltage signal HVF, which is representative of the higher of the first ET voltage EVF and the average power tracking voltage AVT.

Figure 14:
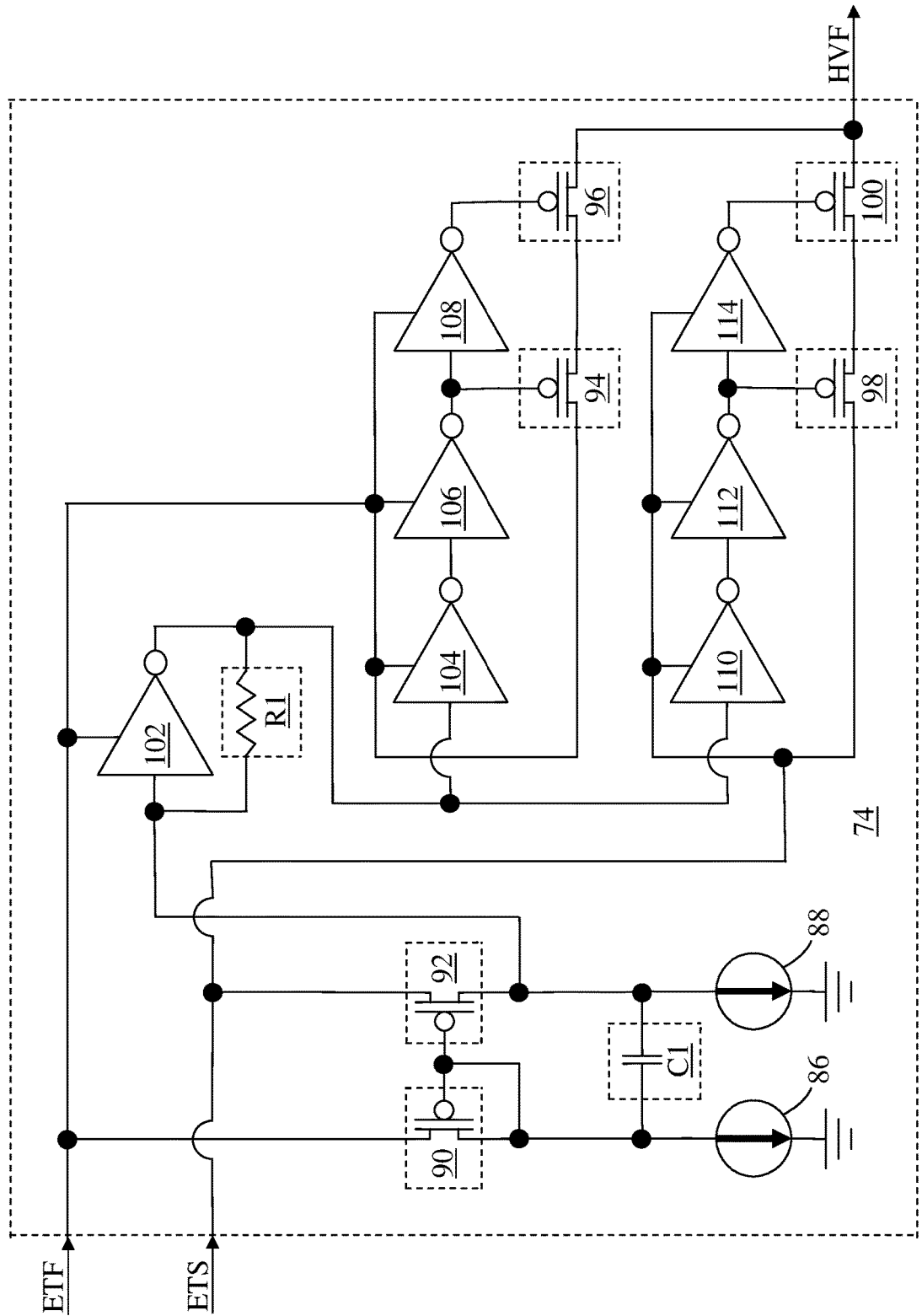
FIG. 14 shows details of the first highest voltage extraction circuit illustrated in FIG. 12 according to one embodiment of the first highest voltage extraction circuit.

FIG. 14 shows details of the first highest voltage extraction circuit 74 illustrated in FIG. 12 according to one embodiment of the first highest voltage extraction circuit 74. The first highest voltage extraction circuit 74 includes a first current source 86, a second current source 88, a fifth PMOS switching element 90, a sixth PMOS switching element 92, a seventh PMOS switching element 94, an eighth PMOS switching element 96, a ninth PMOS switching element 98, a tenth PMOS switching element 100, a first inverter 102, a second inverter 104, a third inverter 106, a fourth inverter 108, a fifth inverter 110, a sixth inverter 112, a seventh inverter 114, a first resistive element R1, and a first capacitive element C1.

The first current source 86 and the second current source 88 are both coupled to ground. The first capacitive element C1 is coupled between the first current source 86 and the second current source 88. The fifth PMOS switching element 90 is coupled between the first envelope tracking power supply 52 (FIG. 7) and the first current source 86. The sixth PMOS switching element 92 is coupled between the second envelope tracking power supply 54 (FIG. 7) and the second current source 88. A gate of the fifth PMOS switching element 90 is coupled to a gate of the sixth PMOS switching element 92. The gate of the fifth PMOS switching element 90 is coupled to a drain of the fifth PMOS switching element 90. The first resistive element R1 is coupled across the first inverter 102. A drain of the sixth PMOS switching element 92 is coupled to an input to the first inverter 102.

The first inverter 102, the second inverter 104, the third inverter 106, and the fourth inverter 108 are coupled in series between the sixth PMOS switching element 92 and the eighth PMOS switching element 96. The first inverter 102, the fifth inverter 110, the sixth inverter 112, and the seventh inverter 114 are coupled between the sixth PMOS switching element 92 and the tenth PMOS switching element 100.

The seventh PMOS switching element 94 is coupled between the first envelope tracking power supply 52 (FIG. 7) and the eighth PMOS switching element 96. The ninth PMOS switching element 98 is coupled between the second envelope tracking power supply 54 (FIG. 7) and the tenth PMOS switching element 100.

The first highest voltage extraction circuit 74 extracts the higher of the first ET voltage EVF (FIG. 12) and the second ET voltage EVS (FIG. 12) to provide the first highest voltage signal HVF. The first capacitive element C1 provides AC hysteresis to reduce susceptibility to AC noise on either of the first ET voltage EVF (FIG. 12) and the second ET voltage EVS (FIG. 12). In one embodiment of the first highest voltage extraction circuit 74, the first highest voltage extraction circuit 74 detects the higher of the first ET voltage EVF (FIG. 12) and the second ET voltage EVS (FIG. 12), such that the first highest voltage signal HVF is always within one diode drop of the higher of the first ET voltage EVF (FIG. 12) and the second ET voltage EVS (FIG. 12). In one embodiment of the first highest voltage extraction circuit 74, the first highest voltage extraction circuit 74 detects the higher of the first ET voltage EVF (FIG. 12) and the second ET voltage EVS (FIG. 12) within four nanoseconds.

Those skilled in the art will recognize improvements and modifications to the embodiments of the present disclosure. All such improvements and modifications are considered within the scope of the concepts disclosed herein and the claims that follow.

What is claimed is:

1. A power amplifier (PA) power supply comprising a first PA connection node, a first power supply, power supply control circuitry, a first switching element, and a second switching element, wherein:
   the PA power supply is configured to:
     operate in one of a plurality of operating modes; and
     during a first operating mode of the plurality of operating modes, provide a first PA power supply signal via the first PA connection node;
   the first switching element is coupled to the first PA connection node;
   the second switching element is coupled between the first power supply and the first PA connection node; and
   during the first operating mode, the power supply control circuitry is configured to:
     select an OFF state of the first switching element using a first switch control signal; and
     adjust a voltage of the first switch control signal to maintain the OFF state of the first switching element using a highest one of at least a voltage at a source of the first switching element and a voltage at a drain of the first switching element.

2. The PA power supply of claim 1 wherein during the first operating mode, the power supply control circuitry is further configured to adjust the voltage of the first switch control signal to maintain the OFF state of the first switching element using a highest one of the voltage at the source of the first switching element, the voltage at the drain of the first switching element, and a direct current (DC) source voltage.

3. The PA power supply of claim 1 wherein the highest one of the voltage at the source of the first switching element and the voltage at the drain of the first switching element is provided by a highest voltage extraction circuit comprising:
   a third switching element coupled between a first current source and the source of the first switching element;
   a fourth switching element coupled between a second current source and the drain of the first switching element; and
   a capacitive element coupled between the third switching element and the fourth switching element.

4. The PA power supply of claim 3 wherein the capacitive element provides alternating current (AC) hysteresis to reduce noise in the highest voltage extraction circuit.

5. The PA power supply of claim 3 wherein the highest voltage extraction circuit detects the highest one of the voltage at the source of the first switching element and the voltage at the drain of the first switching element within 4 nanoseconds.

6. The PA power supply of claim 1 wherein during the first operating mode:
   the first power supply is configured to provide a first power supply signal, such that the first PA power supply signal is based on the first power supply signal; and
   the power supply control circuitry is further configured to select an ON state of the second switching element using a second switch control signal.

7. The PA power supply of claim 1 wherein a propagation delay in transitioning the first switching element from an ON state to the OFF state is less than eight nanoseconds.

8. The PA power supply of claim 1 wherein during the first operating mode, a bandwidth of the first PA power supply signal is greater than 15 megahertz.

9. The PA power supply of claim 1 further comprising a second power supply wherein the first switching element is coupled between the second power supply and the first PA connection node.

10. The PA power supply of claim 9 wherein during a second operating mode of the plurality of operating modes:
   the power supply control circuitry is further configured to select an ON state of the first switching element using the first switch control signal and select an OFF state of the second switching element using a second switch control signal;
   the first power supply is configured to provide a first power supply signal, such that a second PA power supply signal is based on the first power supply signal; and
   the second power supply is configured to provide a second power supply signal, such that the first PA power supply signal is based on the second power supply signal.

11. The PA power supply of claim 10 wherein during the second operating mode, the power supply control circuitry is further configured to adjust a voltage of the second switch control signal to maintain the OFF state of the second switching element using a highest one of a voltage at a source of the second switching element and a voltage at a drain of the second switching element.

12. The PA power supply of claim 9 wherein during the first operating mode:
the power supply control circuitry is further configured to select an ON state of the second switching element using a second switch control signal;
the first power supply is configured to provide a first power supply signal, such that the first PA power supply signal is based on the first power supply signal; and
the second power supply is configured to provide a second power supply signal, such that a second PA power supply signal is based on the second power supply signal.

13. The PA power supply of claim 12 wherein during the first operating mode:
a first radio frequency (RF) PA is configured to receive and amplify a first RF input signal to provide a first RF transmit signal using the first PA power supply signal;
a second RF PA is configured to receive and amplify a second RF input signal to provide a second RF transmit signal using the second PA power supply signal; and
the first RF transmit signal and the second RF transmit signal are transmit uplink carrier aggregation signals.

14. The PA power supply of claim 1 wherein:
the first switching element is a first P-type metal oxide semiconductor (PMOS) switching element;
the second switching element is a second PMOS switching element;
the PA power supply further comprises a first N-type metal oxide semiconductor (NMOS) switching element and a second NMOS switching element;
the first NMOS switching element is coupled across the first PMOS switching element and the second NMOS switching element is coupled across the second PMOS switching element; and
during the first operating mode, the power supply control circuitry is further configured to select an OFF state of the first NMOS switching element using a first NMOS switch control signal and select an ON state of the second NMOS switching element using a second NMOS switch control signal, such that the second NMOS switching element is configured to assist the second PMOS switching element.

15. The PA power supply of claim 1 wherein:
the first power supply is a first envelope tracking (ET) power supply; and
during the first operating mode:
the first ET power supply is configured to provide a first ET power supply signal, such that the first PA power supply signal is based on the first ET power supply signal; and
the power supply control circuitry is further configured to select an ON state of the second switching element using a second switch control signal.

16. The PA power supply of claim 15 further having a second PA connection node and further comprising an average power tracking power supply, a third switching element, and a fourth switching element, wherein:
the first switching element is further coupled between the average power tracking power supply and the first PA connection node;
the third switching element is coupled between the average power tracking power supply and the second PA connection node;
the fourth switching element is coupled between the first ET power supply and the second PA connection node;
during the first operating mode, the average power tracking power supply is configured to provide an average power tracking power supply signal, such that a second PA power supply signal is based on the average power tracking power supply signal; and
during the first operating mode, the power supply control circuitry is further configured to select an ON state of the third switching element using a third switch control signal and select an OFF state of the fourth switching element using a fourth switch control signal.

17. The PA power supply of claim 16 wherein during a second operating mode of the plurality of operating modes:
the power supply control circuitry is further configured to:
select an ON state of the first switching element using the first switch control signal;
select an OFF state of the second switching element using the second switch control signal;
select an OFF state of the third switching element using the third switch control signal; and
select an ON state of the fourth switching element using the fourth switch control signal;
the first PA power supply signal is based on the average power tracking power supply signal; and
the second PA power supply signal is based on the first ET power supply signal.

18. The PA power supply of claim 15 further having a second PA connection node and further comprising a third switching element and a fourth switching element, wherein:
the first switching element is further coupled between a direct current (DC) power source and the first PA connection node;
the third switching element is coupled between the DC power source and the second PA connection node;
the fourth switching element is coupled between the first ET power supply and the second PA connection node;
during the first operating mode, the DC power source is configured to provide a DC source signal, such that a second PA power supply signal is based on the DC source signal; and
during the first operating mode, the power supply control circuitry is further configured to select an ON state of the third switching element using a third switch control signal and select an OFF state of the fourth switching element using a fourth switch control signal.

19. The PA power supply of claim 18 wherein during a second operating mode of the plurality of operating modes:
the power supply control circuitry is further configured to:
select an ON state of the first switching element using the first switch control signal;
select an OFF state of the second switching element using the second switch control signal;
select an OFF state of the third switching element using the third switch control signal; and
select an ON state of the fourth switching element using the fourth switch control signal;
the first PA power supply signal is based on the DC source signal; and
the second PA power supply signal is based on the first ET power supply signal.

20. The PA power supply of claim 19 wherein during the second operating mode, the power supply control circuitry is further configured to:
adjust a voltage of the second switch control signal to maintain the OFF state of the second switching element using a highest one of a voltage at a source of the second switching element, a voltage at a drain of the second switching element, and a DC source voltage; and adjust a voltage of the third switch control signal to maintain the OFF state of the third switching element using a highest one of a voltage at a source of the third switching element, a voltage at a drain of the third switching element, and the DC source voltage.

\* \* \* \* \*